(12) United States Patent
Sadler et al.

(10) Patent No.: US 6,809,524 B1
(45) Date of Patent: Oct. 26, 2004

(54) TESTING OF CONDUCTING PATHS USING A HIGH SPEED I/O TEST PACKAGE

(75) Inventors: Brian Sadler, San Jose, CA (US); Mohsen Hossein Mardi, San Jose, CA (US); David M. Mahoney, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 34 days.

(21) Appl. No.: 10/340,493

(22) Filed: Jan. 10, 2003

(51) Int. Cl.[7] .............. G01R 31/02; G01R 27/08; H01H 31/04
(52) U.S. Cl. .............. 324/538; 324/755; 324/722; 324/158.1
(58) Field of Search .................. 324/722, 537, 324/508, 754–755, 538, 158.1, 758; 439/55, 63, 70, 264, 330, 525; 714/734; 702/117; 174/261–262; 438/125, 127; 257/666; 703/28

(56) References Cited

U.S. PATENT DOCUMENTS

| | | | | |
|---|---|---|---|---|
| 4,176,780 A | * | 12/1979 | Sacher et al. | 714/736 |
| 4,853,626 A | | 8/1989 | Resler | |
| 5,218,293 A | * | 6/1993 | Kan | 324/761 |
| 5,731,227 A | * | 3/1998 | Thomas | 438/125 |
| 6,081,429 A | * | 6/2000 | Barrett | 361/767 |
| 6,668,242 B1 | * | 12/2003 | Reynov et al. | 703/28 |

* cited by examiner

*Primary Examiner*—Kamand Cuneo
*Assistant Examiner*—Paresh Patel
(74) *Attorney, Agent, or Firm*—Justin Liu

(57) ABSTRACT

A method and apparatus for testing parasitic effects on conducting paths in high-speed systems using a test package which allows for very accurate measurements of the parasitic effects to be taken. The test package is designed to be nearly identical to the actual IC package and has an external connector to allow measurements to be taken through the package, instead of at a point close to the package.

19 Claims, 7 Drawing Sheets

(SIDE VIEW)

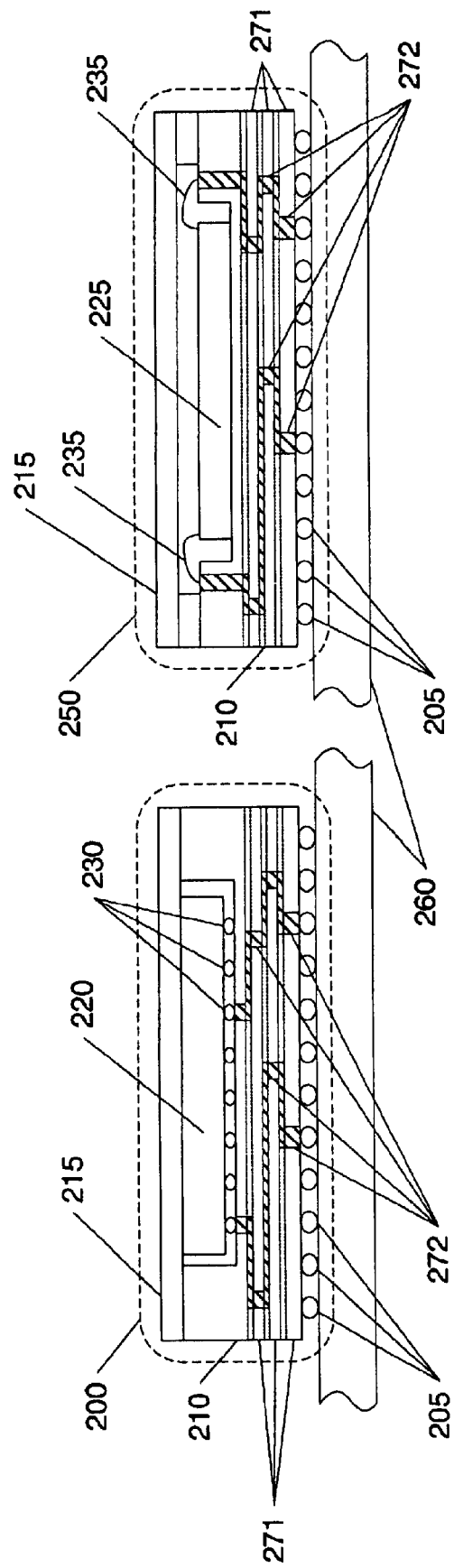

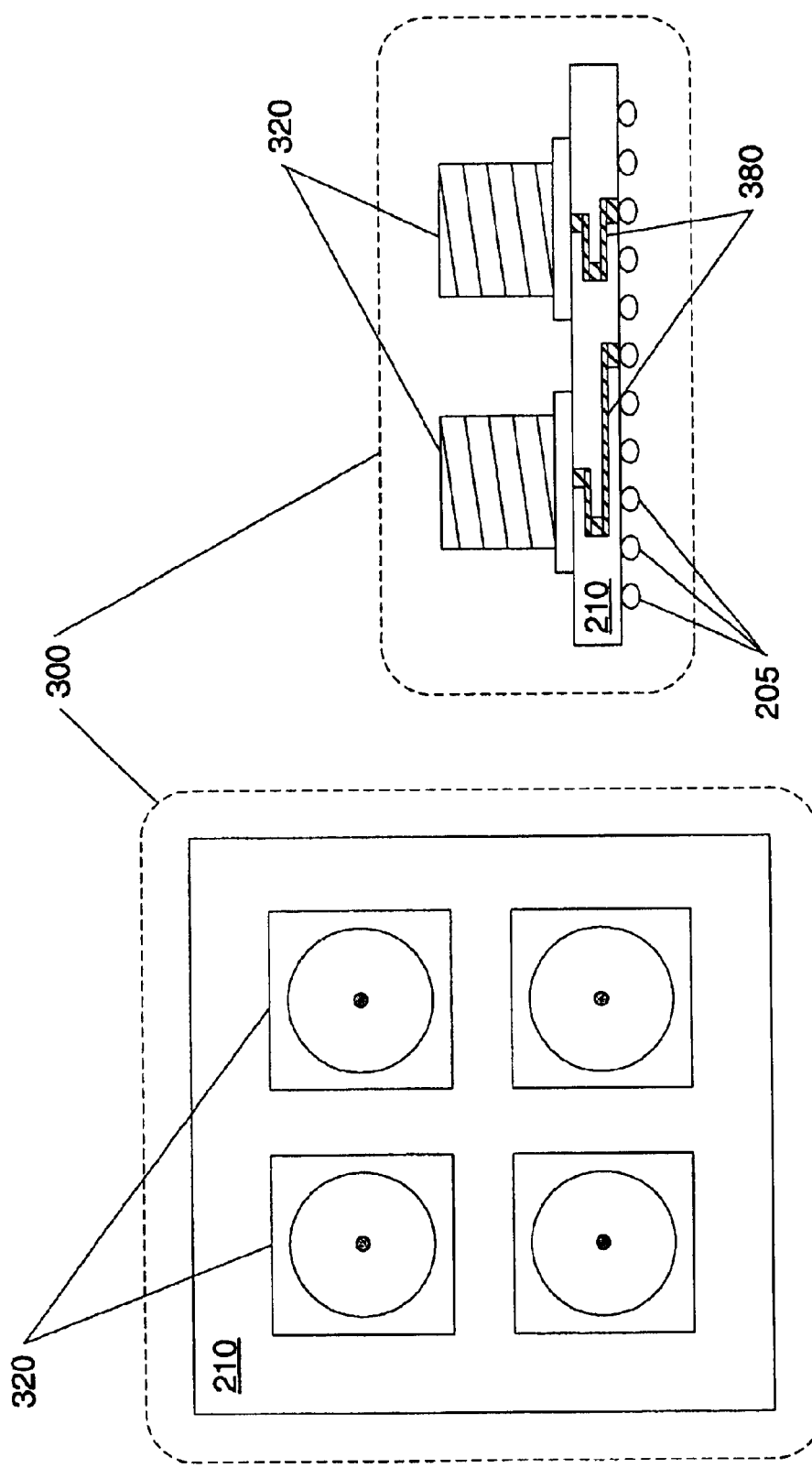
FIG. 3B (SIDE VIEW)
FIG. 3A (TOP VIEW)

TESTING OF CONDUCTING PATHS USING A HIGH SPEED I/O TEST PACKAGE

FIELD OF THE INVENTION

The invention relates to testing of high-speed systems. More particularly, the invention relates to a test package for accurate testing of high-speed systems.

BACKGROUND OF THE INVENTION

The performance of a system is dependent on the performance and characteristics of each of the individual components within the system and the signal paths connecting the components. A system can only run as fast as its slowest link. In designing and testing a system to meet performance criteria, it is important to ensure that each component and path of the system is able to meet or exceed the performance requirements.

A given system may need to operate at certain frequencies, and, in order to do so, each component and path in the system must also be capable of supporting those frequencies. Modern systems must run at ever-increasing frequencies, and as the speed of these systems increase, guaranteeing error-free performance at speed becomes more and more critical. At multi-gigabit speeds and beyond, a very small timing error can have enormous consequences and cause fatal errors.

In order to meet performance requirements, the components and paths in a system are designed carefully to ensure that they meet the specific performance targets. These parts are usually simulated during the design phase, and then, after fabrication or manufacturing, tested for their performance characteristics. It is important to be able to understand and characterize the performance of the part as accurately as possible.

One component of a system can be the printed circuit board (PCB). A system may have several such circuit boards, each having one or more integrated circuits (ICs) and other components mounted on it, which are connected by traces. A trace is a conducting path on a PCB which can carry a signal. In modern high-speed systems, insertion loss and off-chip loading from the traces often dominates the overall performance of the system. The parasitic effects, that is resistance, capacitance, and inductance, presented by the traces on the circuit board can be orders of magnitude greater than those found inside an IC. Therefore, the ability to measure and characterize accurately the effects of these traces can be very important.

Simulation of the traces is usually based on a behavioral model which is developed using empirical data. Accuracy of a simulation depends on many factors, including the accuracy of the model, and the computing power and time available. For high-speed systems, simulation may only offer a rough estimate of the behavior of the trace, and lacks the precision necessary for modern systems. As speeds continue to increase and models become more complex and less accurate, simulation may not be practical.

After manufacturing, a trace may be tested by connecting a probe to a circuit board. This may be done with none, some, or all of the ICs and other components mounted on the board. A small "stub," which is a short partial trace attached to the main trace, may be provided so that a probe may be connected to that point. However, even when the stub is very close to the endpoint of the trace (where a signal starts or ends), there are inaccuracies because the measurement point is not at the exact endpoint. Measurements taken from a probe connected to a stub may include erroneous data caused by reflections from the real endpoint, the effects of the stub itself, interference from IC switching activity, or other factors.

Probes may also be attached elsewhere, but ultimately, accurate measurement is limited by the placement of the probes. Any probe that is not attached in exactly the same place and manner as the component or path being tested will necessarily introduce inaccuracies in measurement. Therefore, a need exists for a way to test a component or path of a system with a high degree of accuracy by testing at the actual point of interest.

SUMMARY OF THE INVENTION in accordance with the present invention, a test package with a connector that allows for an external connection to be made is placed in a system for testing. The package is designed in such a way as to allow the user to test conducting paths in the system with a very high degree of accuracy under conditions which closely mimic actual operating conditions.

In accordance with another embodiment of the present invention, a method for testing comprises placing a test package in a system and connecting an external tester to the test package. The external tester can then be used to send or receive signals to and from conducting paths in the system through the test package.

BRIEF DESCRIPTION OF THE DRAWINGS

The present invention is illustrated by way of example, and not by way of limitation, in the following figures. Like reference numerals refer to similar elements.

FIGS. 2A and 2B shows cross-sections of prior art packages.

FIGS. 3A and 3B show a top view and a cross-sectional view, respectively, of a test package in accordance with the present invention.

DETAILED DESCRIPTION OF THE DRAWINGS

The present invention is believed to be applicable to a variety of high-speed systems. The present invention has been found to be particularly applicable and beneficial for testing of high-speed traces. While the present invention is not so limited, an appreciation of the present invention is presented by way of specific examples.

In the following description, numerous specific details are set forth to provide a more thorough understanding of the present invention. However, it will be apparent to one of ordinary skill in the art that the present invention can be practiced without these specific details.

Figure 1:
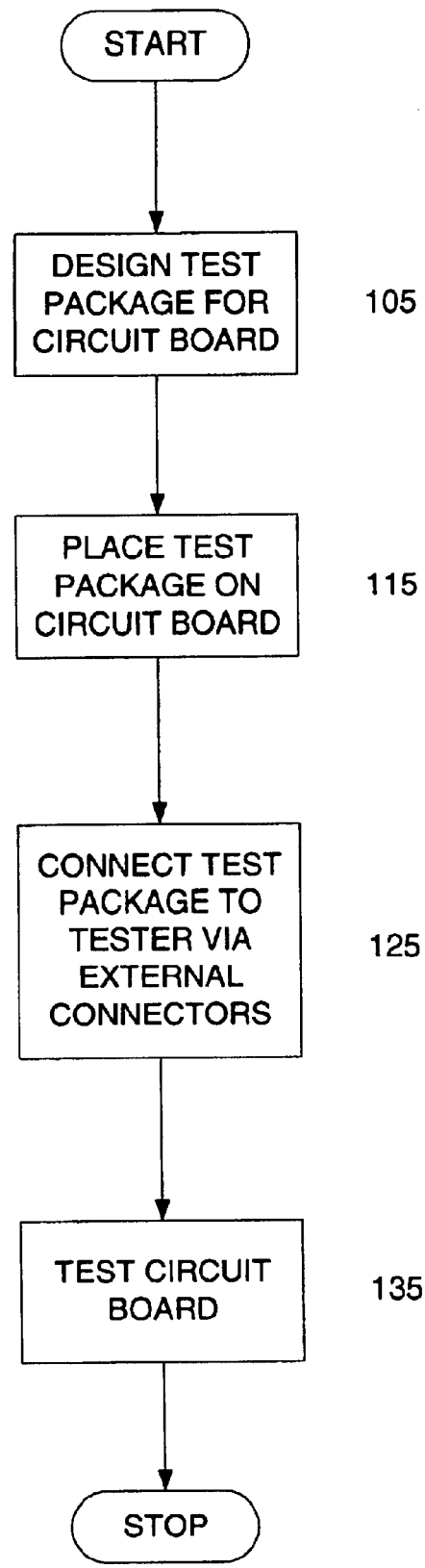
FIG. 1 shows a flow diagram for testing in accordance with the present invention.

FIG. 1 shows a flow diagram of a method for testing a trace, or a conducting path, on a circuit board. First, a special test package is designed and built to replace a regular IC on the circuit board (step 105). Then, the test package is attached to the board through the package connectors in the same way the regular IC would have been attached (step 115). The test package has a high-speed external connector, which allows for connection to external test equipment (step 125). Finally, traces on the circuit board are tested by signals that are sent to and from the test equipment, through the special test package.

The special test package is designed to allow for connection to the circuit board in place of a regular IC through package connectors (such as solder balls or pins). The test package is also designed to have a high-speed external connector so that it can be connected to external test equipment, or other external devices. By designing the test package in this way, it is possible to take measurements to characterize the traces on the circuit board starting from exactly the same point as the starting point of traces connecting the actual IC that will be placed on the circuit board. This allows for very precise measurements of the performance characteristics of the traces on the circuit board in a test environment that closely mimics the environment in which the actual IC operates.

FIGS. 2A and 2B show examples of standard IC packages that can be used on a circuit board 260. IC package 200 on FIG. 2A is a flip-chip package, wherein a silicon die 220 is placed in the package "upside-down." The upside-down die 220 connects to a substrate 210 through a plurality of solder bumps 230. A substrate 210 can be composed of any material which can be used for an IC package substrate, as one of ordinary skill in the art will readily understand. Substrate 210 is generally one or more layers of a dielectric material 271. Within each layer, conducting paths connect different points and carry signals across the layer. Holes 272 are formed in layers and filled with a conducting material to pass signals between layers. These conducting paths between layers are called vias.

The IC package will have package connectors that allow for a physical and electrical connection to be made between the package and the circuit board. In a ball grid array (BGA) package (as shown in the examples in FIGS. 2A and 2B) the signal paths that travel through the conducting paths and vias of substrate 210 terminate at solder balls 205. These solder balls are the package connectors that allow the IC package to be connected both physically and electrically to the circuit board. In a BGA package, solder balls 205 are arranged in a grid or an array. Other types of package connectors, such as pins, can also be used with the invention, as one of ordinary skill in the art will appreciate. The rest of the IC package generally consists of components and materials that can provide structural support and/or dissipate heat produced by the IC, such as a heatspreader 215.

FIG. 2B shows an IC package 250 in a different configuration. In this case, a silicon die 225 is right side up, and is connected to the substrate through bonding wires 235 (and not solder bumps). Bonding wires 235 are thin, conducting wires which are connected to silicon die 225 on one end and to substrate 210 on the other. IC package 250 then has elements to carry signals and connect to the circuit board, and for dissipating heat, much as IC package 200. The present invention can be used with other types of package arrangements as well.

Generally, in a standard IC package such as packages 200 and 250, an output signal originates on silicon die 220 or 225 and travels from the die to substrate 210 though either solder bumps 230 or bonding wires 235. The signal then travels through the traces and vias of substrate 210 until it reaches solder balls 205, where the signal leaves the IC and enters a trace on the circuit board. An input to the chip follows such a path in the reverse direction.

FIGS. 3A and 3B show top and side views of a test package 300 which can be used to replace a regular IC on a circuit board for testing. Test package 300 can have a substrate 210, which is similar in construction to the substrate used in the regular IC. In a preferred embodiment, the substrate is made from the same material as, and designed to be nearly identical to, the substrate used in the actual IC being replaced by test package 300. This allows measurements taken using test package 300 to accurately reflect the conditions of the regular IC in the system.

On one side (the bottom) of substrate 210 of test package 300, there are solder balls 205 which physically and electrically connect test package 300 to the circuit board in the same manner as a standard IC package. As with standard IC packages, the solder balls 205 can be arranged in an array for a BGA package. In a preferred embodiment, test package 300 is pin compatible with the regular IC it replaces so that test package 300 can be attached to the circuit board without modification of the circuit board. Other package connectors can be used to join test package 300 and the circuit board (such as pins), as is known to those of ordinary skill in the art.

On the other (top) side of substrate 210 of test package 300, there are one or more external connectors 320. These external connectors allow an external tester, or other external equipment, to be connected to the test package. In one embodiment, the external connectors can be standard SMA (Sub-Miniature-A) connectors. Other standard or custom connectors can also be used, depending on the testing needs or the requirements of the external equipment. For very high-speed applications, the external connectors can be shielded, so as to reduce the effects of noise.

A signal traveling through the test package would start from the test or external equipment, and travel in through an external connector 320, down through substrate 210 through conducting path 380, and out a solder ball 205 (or other package connector) to the circuit board. A signal originating from the board would travel in the reverse direction back to the test equipment.

Figure 4B:
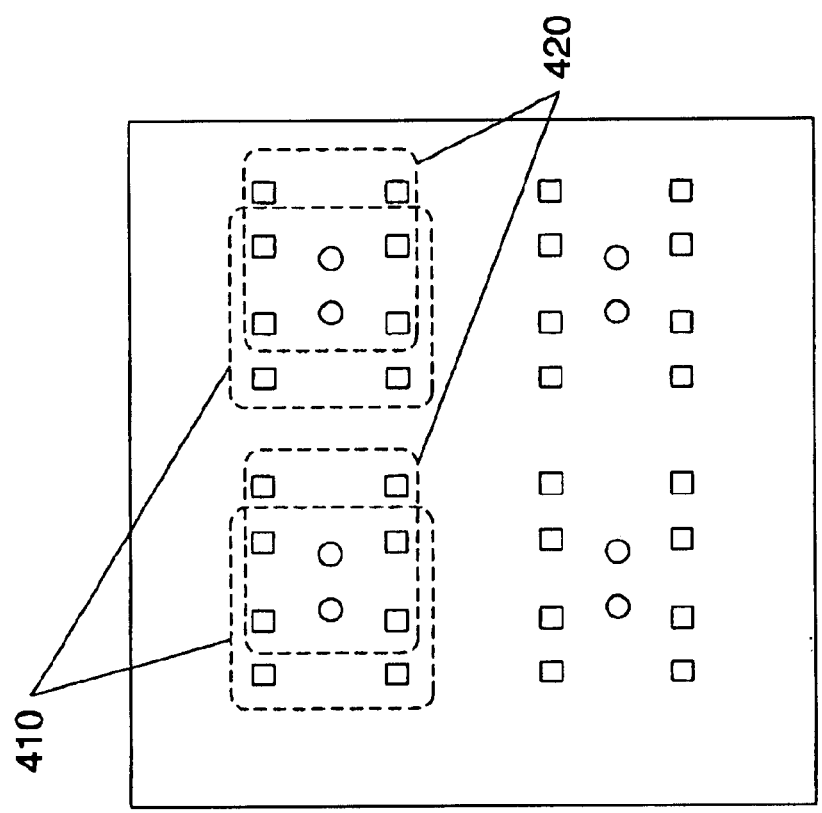
FIGS. 4A and 4B show possible configurations of the top layer of a test package in accordance with the present invention.
Figure 4A:
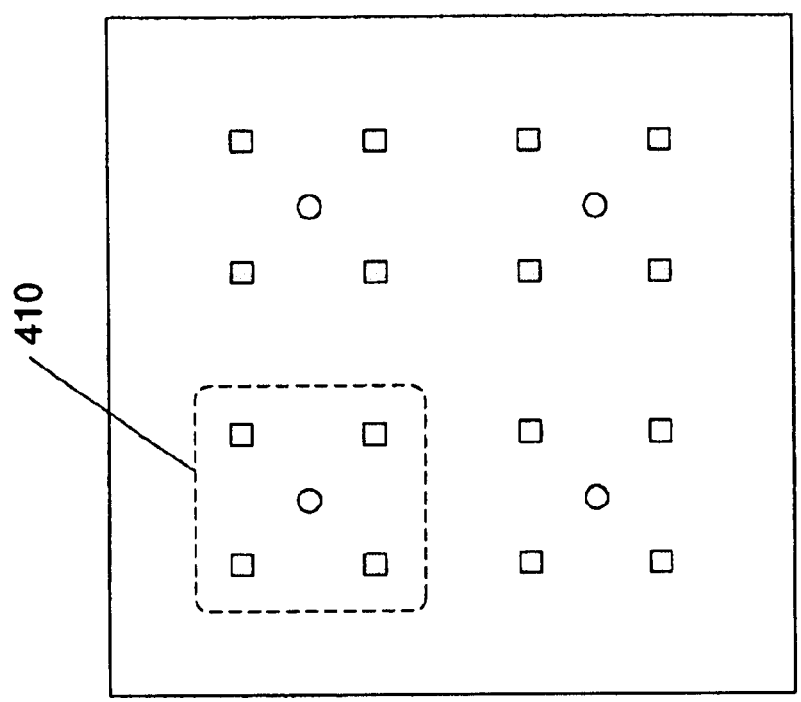

FIG. 4A shows one embodiment of a top layer for the substrate of the test package. A mounting pad 410 (inside the dashed box) shows where an external connector can be mounted or connected. The example shown in FIG. 4A has four such mounting pads 410. This number can be varied depending on the size of the package, the size of the external connector, and the specific needs of the test conditions.

Figure 5:
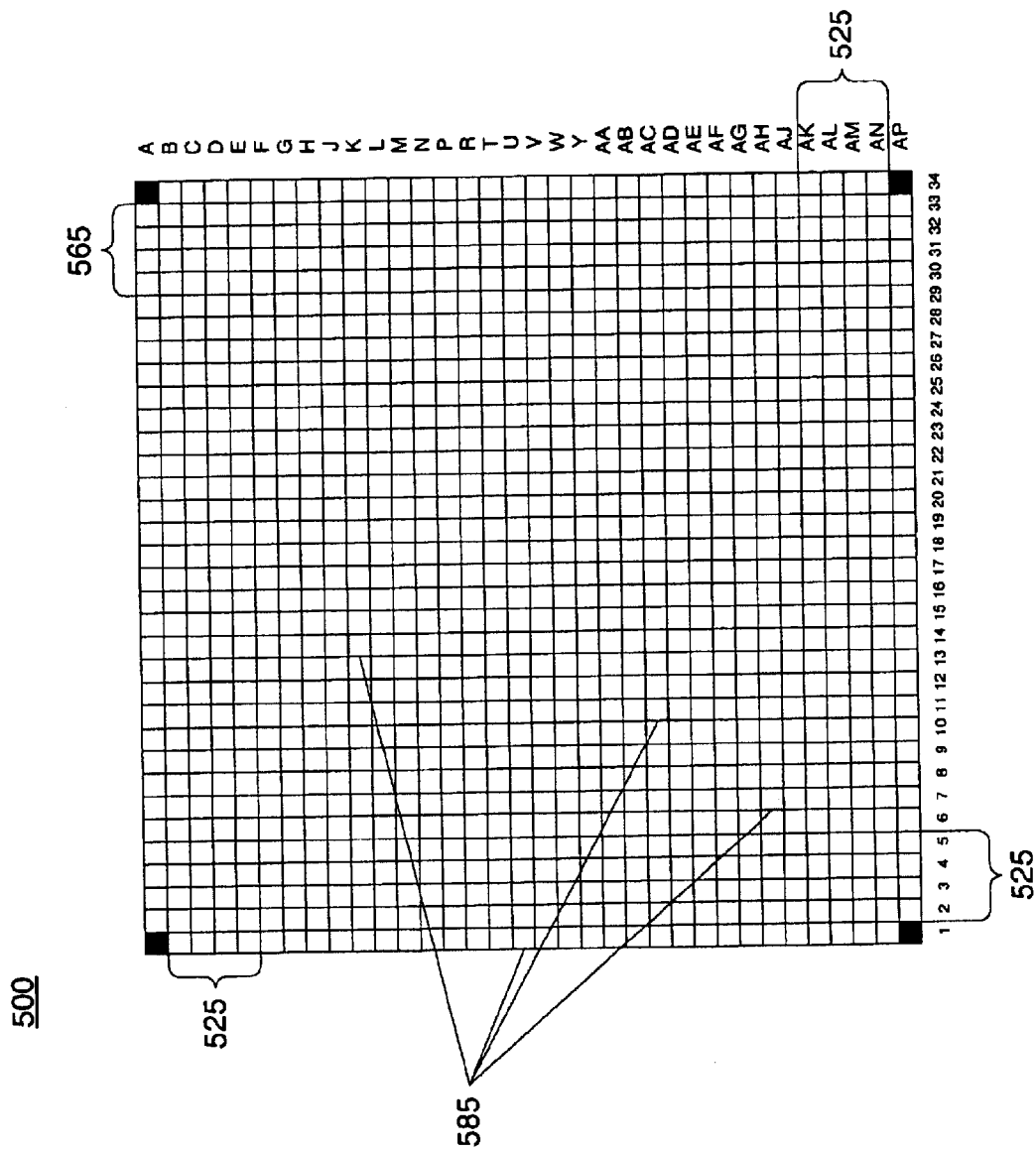
FIG. 5 shows a representation of the bottom view of a test package in accordance with the present invention.

FIG. 5 shows a representation of the bottom of a BGA package where the grid of solder balls is located. In this example, an FF1152 flip-chip fine-pitch BGA package is shown, which would have 1152 solder balls, each represented by a box, arranged in columns from 1 to 34 and in rows from A to AP. As an example, signals from the four external connectors of the test package could be routed through the substrate to the four solder ball locations 565 (located at cols. 30–33, row A). Also in this example, since the package is symmetric about both its X and Y axes, the same test package could be used, without any redesign or re-manufacturing, to test signals at locations 525 (col. 1, rows B–E; cols. 2–5, row AP; and col. 34, rows AK–AN) by simply rotating the test package. These locations are, of course, completely arbitrary, and the signals from the external connectors of the test package can be routed to any solder ball location where testing capability is needed.

FIG. 4B show another possible top layer configuration for the test package. In this example, there are eight mounting pads where external connectors can be attached, divided into two groups of four. A first group of mounting pads 410 (shown darkened on FIG. 4B) are in the same location as before, but a second group of mounting pads 420 (shown in white on FIG. 4B) are slightly offset from the first group. Second group 420 can then be routed to a different set of four solder ball locations. For example, on FIG. 5, the first group of mounting pads 410 can still be routed to locations 565 as before, and the second group of mounting pads can be routed to locations 585. This allows the same substrate, without requiring any redesign or re-manufacturing, to be used to test multiple sets of solder ball locations (and the associated circuit traces). All that is required is attaching the external connectors to the mounting pads that are connected to the signal paths of interest. This technique of using multiple groups of mounting pads, each slightly offset from each other, can, of course, be extended for use with more than two groups. Also, as before, a test package with multiple groups of mounting pads can be rotated as before (if it is symmetrical) to further expand the number of signal paths that can be tested.

Figure 6:
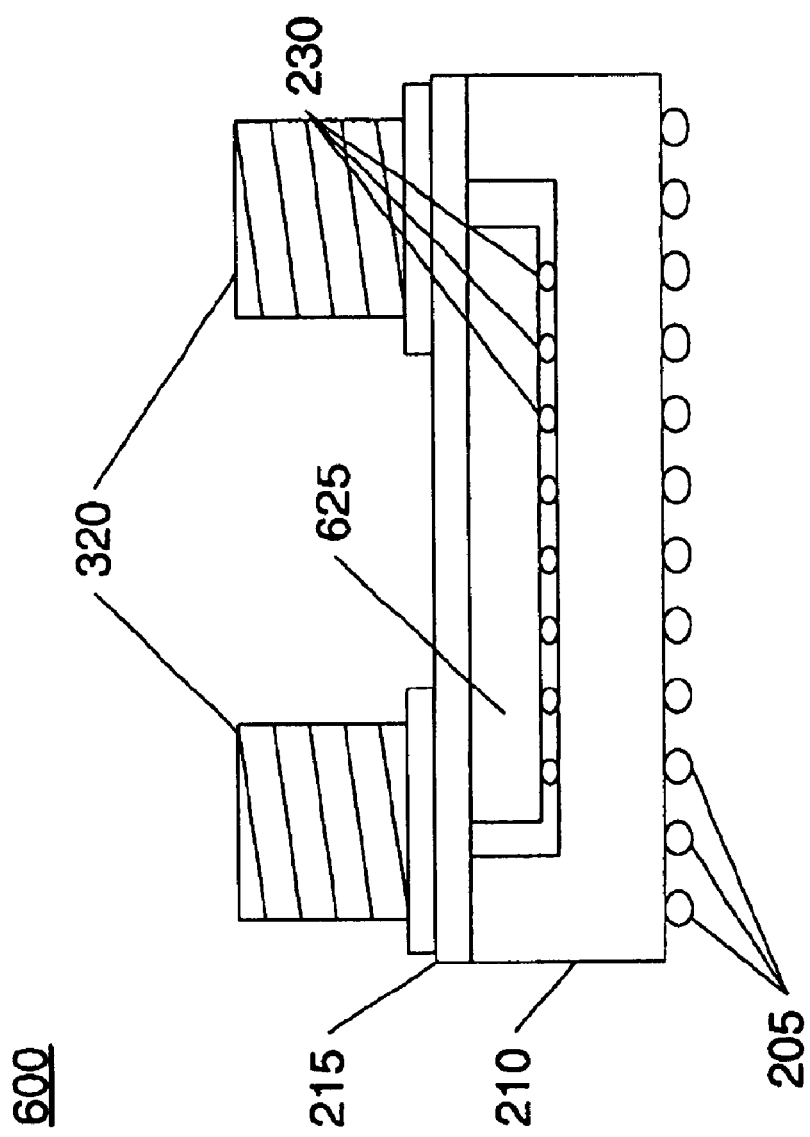
FIG. 6 shows a cross-sectional view of a test package in accordance with the present invention.

As shown in FIG. 6, in another embodiment of the present invention, a silicon die 625 (similar to silicon dice 220 and 225) used in the regular IC package can be used in the test package. In this example, a test package 600 includes silicon die 625 that connects to substrate 210 through solder bumps 230 in the same manner as in IC package 200. Test package 600 also includes one or more external connectors 320, located away from the area occupied by silicon die 625, that are connected to substrate 210. In this configuration, external signals can be connected through external connectors 320 and be routed through substrate 210 to either silicon die 625, for connection to the chip, or solder balls 205, for connection to the circuit board.

Figure 7:
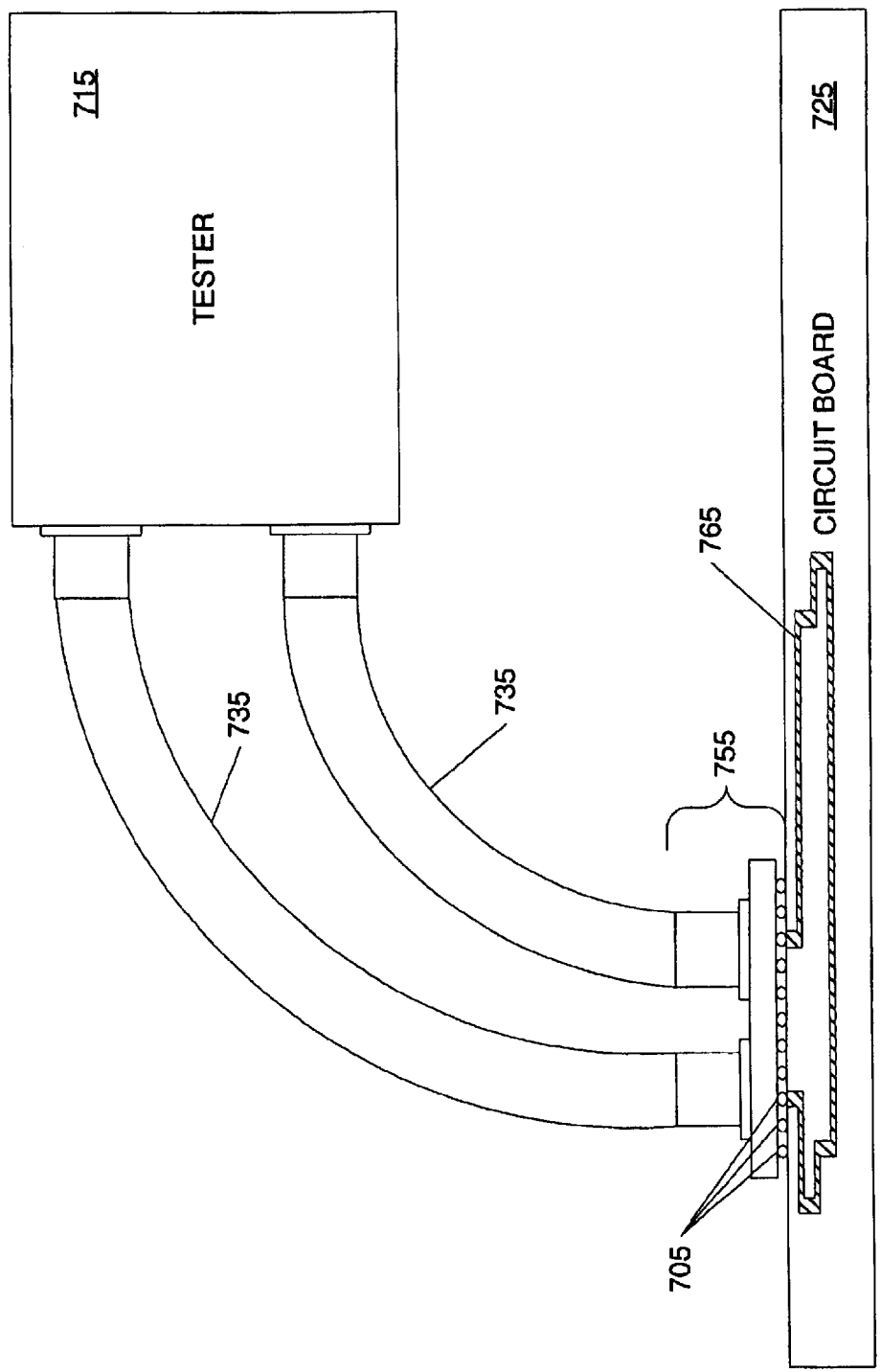
FIG. 7 shows a representation of a test setup in accordance with the present invention.

FIG. 7 shows a test package 755 in one possible test configuration. Test package 755 can be of a type in accordance with either test package 300, test package 600, or other test package configurations. The test package is connected to circuit board 725 on one side through package connectors, and through cables 735 to a tester 715 on the other side through external connectors. Signals can be sent and received by tester 715 through test package 300.

In one embodiment, a trace 765 on the circuit board can loop back, so that each end of the trace is connected to a different solder ball location (e.g., 705) on the same test package. If those two solder ball locations are routed to two external connectors, then the trace can be tested as follows. A signal can be input from the test equipment through a first external connector. The test input signal travels through the test package, out the loop trace, back up through the test package, and out at a second external connector. The test equipment can compare the original signal input to the first external connector against the signal received from the second external connector to determine the effects of the loop trace. In one embodiment of the present invention, the test equipment can be a network analyzer.

Those having skill in the relevant arts of the invention will now perceive various modifications and additions that can be made as a result of the disclosure herein. For example, the above text describes the circuits and methods of the invention in the context of ICs. However, the circuits of the invention can also be implemented in other electronic systems, for example, in printed circuit boards including discrete devices.

Accordingly, all such modifications and additions are deemed to be within the scope of the invention, which is to be limited only by the appended claims and their equivalents.

What is claimed is:

1. A method for testing a conducting path in a system comprising:

connecting a test IC package to the conducting path in the system through a package connector of the test IC package, wherein the package connector is on a bottom of the test IC package;

connecting the test IC package to external equipment through a high-speed external connector of the test IC package, wherein the high-speed external connector is mounted to a mounting pad on the test IC package;

routing a conducting path within the test IC package from the package connector to the high-speed external connector through a substrate of the test IC package and testing the conducting path in the system using the external equipment.

2. The method of claim 1 wherein the mounting pad is on a top surface of the test IC package.

3. The method of claim 1 further comprising the step of designing the test IC package to replace a regular IC package.

4. The method of claim 3 wherein the designing step comprises designing the test package to be constructed from the same materials as the regular IC.

5. The method of claim 3 wherein the designing step comprises designing the test IC package to be pin compatible with the regular IC package.

6. The method of claim 1 further comprising the further steps of rotating the test IC package with respect to the conducting path in the system and again connecting the high-speed external connector of the test IC package to the external equipment.

7. The method of claim 1 wherein the external equipment is a tester.

8. The method of claim 1 wherein the external equipment is a network analyzer.

9. The method of claim 1 wherein the conducting path in the system is a loop trace.

10. The method of claim 9 further comprising the steps of:

applying an input signal to a first end of the loop trace through the test IC package;

receiving an output signal from a second end of the loop trace through the test IC package; and comparing the input signal and the output signal.

11. The method of claim 1 wherein the conducting path in the system is a trace on a printed circuit board.

12. A test IC package for testing a conducting path in a system comprising:

a high-speed external connector mounted to a mounting pad on the test IC package; and a package connector on a bottom of the test IC package wherein the high-speed external connector is connected to the package connector via a conducting path through a substrate of the test IC package.

13. The test IC package of claim 12 wherein the mounting pad is on a top surface of the test IC package.

14. The test IC package of claim 12 wherein the high-speed external connector is large compared to the package connector.

15. The test IC package of claim 12 wherein the high-speed external connector is a shielded connector.

16. The test IC package of claim 15 wherein the shielded connector is an SMA connector.

17. The test IC package of claim 12 wherein the package connector is a solder ball of a ball grid array.

18. The test IC package of claim 12 wherein the package connector is a pin.

19. The test IC package of claim 12, wherein the mounting pad is a first mounting pad, further comprising a second mounting pad at an offset to the first mounting pad, and wherein the high-speed external connector is mounted on one of the first and second mounting pads.

* * * * *